(12) United States Patent
Won et al.

(10) Patent No.: US 9,035,398 B2
(45) Date of Patent: May 19, 2015

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Seok-Jun Won, Seoul (KR); Suk-Hoon Kim, Yongin-si (KR); Hyung-Suk Jung, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/010,961

(22) Filed: Aug. 27, 2013

(65) Prior Publication Data

US 2014/0077281 A1    Mar. 20, 2014

(30) Foreign Application Priority Data

Sep. 14, 2012  (KR) ........................ 10-2012-0102241

(51) Int. Cl.
*H01L 29/66*  (2006.01)
*H01L 29/78*  (2006.01)
*H01L 21/8238*  (2006.01)
*H01L 21/28*  (2006.01)
*H01L 29/49*  (2006.01)
*H01L 29/51*  (2006.01)

(52) U.S. Cl.
CPC ........ *H01L 29/78* (2013.01); *H01L 21/823842* (2013.01); *H01L 21/823857* (2013.01); *H01L 21/28176* (2013.01); *H01L 21/28194* (2013.01); *H01L 29/4966* (2013.01); *H01L 29/513* (2013.01); *H01L 29/517* (2013.01); *H01L 29/66545* (2013.01)

(58) Field of Classification Search
CPC ............... H01L 21/28079; H01L 21/28088; H01L 29/4958; H01L 29/66545
USPC ......... 257/330, 331, 288, 326, 314, 369, 411, 257/410
See application file for complete search history.

(56) References Cited

U.S. PATENT DOCUMENTS

| | | | |
|---|---|---|---|
| 7,871,915 B2 | 1/2011 | Lim et al. | |
| 8,058,119 B2 | 11/2011 | Chung et al. | |
| 8,084,824 B2 | 12/2011 | Yu et al. | |
| 2010/0068875 A1 | 3/2010 | Yeh et al. | |
| 2011/0121399 A1 | 5/2011 | Park et al. | |
| 2011/0241130 A1* | 10/2011 | Chan et al. | 257/410 |
| 2011/0309434 A1 | 12/2011 | Huang et al. | |
| 2012/0028434 A1 | 2/2012 | Lee et al. | |

(Continued)

FOREIGN PATENT DOCUMENTS

JP    2012-038821 A    2/2012
KR    10-2012-0022252 A    3/2012

*Primary Examiner* — Matthew Reames
*Assistant Examiner* — Vincent Wall
(74) *Attorney, Agent, or Firm* — Lee & Morse, P.C.

(57) ABSTRACT

A semiconductor device includes an interlayer insulating film on a substrate, the interlayer insulating film including a trench, a gate insulating film in the trench, a diffusion film on the gate insulating film, the diffusion film including a first diffusion material, a gate metal structure on the diffusion film, the gate metal structure including a second diffusion material, and a diffusion prevention film between the gate metal structure and the diffusion film, the diffusion prevention film being configured to prevent diffusion of the second diffusion material from the gate metal structure, the first diffusion material diffused from the diffusion film exists in the gate insulating film.

19 Claims, 12 Drawing Sheets

(56) References Cited

U.S. PATENT DOCUMENTS

| | | |
|---|---|---|
| 2012/0043614 A1 | 2/2012 | Choi et al. |
| 2012/0056269 A1 | 3/2012 | Chung et al. |
| 2012/0068261 A1 | 3/2012 | Kwon et al. |
| 2012/0126295 A1* | 5/2012 | Edge et al. ............. 257/288 |
| 2012/0319179 A1* | 12/2012 | Huang et al. ............. 257/288 |

* cited by examiner

SEMICONDUCTOR DEVICE AND METHOD OF FABRICATING THE SAME

CROSS-REFERENCE TO RELATED APPLICATION

Korean Patent Application No. 10-2012-0102241, filed on Sep. 14, 2012, in the Korean Intellectual Property Office, and entitled: "SEMICONDUCTOR DEVICE AND METHOD OF FABRICATING THE SAME," is incorporated by reference herein in its entirety.

BACKGROUND

1. Field

Embodiments relate to a semiconductor device and to a method of fabricating the same.

2. Description of the Related Art

As the feature size of metal oxide semiconductor (MOS) transistors is reduced, a gate and a channel formed under the gate are becoming shorter. Therefore, various research is being conducted to increase the capacitance between the gate and the channel and to improve operating characteristics of the MOS transistors.

For example, a silicon oxide film, primarily used as a gate insulating film, faces physical limitations in its electrical properties as it becomes thinner. Therefore, to replace the conventional silicon oxide film, a high-k film having a high dielectric constant is being actively researched. The high-k film can reduce a leakage current between a gate electrode and a channel region, while maintaining a small equivalent oxide thickness. In another example, as polysilicon, primarily used as a gate material, has greater resistance than most metals, a polysilicon gate electrode is being replaced by a metal gate electrode.

SUMMARY

Aspects of embodiments provide a semiconductor device in which a threshold voltage (Vt) of a transistor can be adjusted easily.

Aspects of embodiments also provide a method of fabricating a semiconductor device in which a threshold voltage (Vt) of a transistor can be adjusted easily.

According to embodiments, there is provided a semiconductor device, including an interlayer insulating film on a substrate, the interlayer insulating film including a trench, a gate insulating film in the trench, a diffusion film on the gate insulating film, the diffusion film including a first diffusion material, a gate metal structure on the diffusion film, the gate metal structure including a second diffusion material, and a diffusion prevention film between the gate metal structure and the diffusion film, the diffusion prevention film being configured to prevent diffusion of the second diffusion material from the gate metal structure, wherein the first diffusion material diffused from the diffusion film exists in the gate insulating film.

The first diffusion material may be the same as the second diffusion material.

The semiconductor device may further include a diffusion control film under the diffusion film, the diffusion control film being configured to control diffusion of the first diffusion material from the diffusion film.

The semiconductor device may further include a work function adjustment film under the diffusion film, the work function adjustment film including the first diffusion material.

A content of the first diffusion material in the diffusion film may be greater than a content of the first diffusion material in the work function adjustment film, and the content of the first diffusion material in the work function adjustment film may be greater than a content of the first diffusion material in the gate insulating film.

The diffusion film may be a work function adjustment film of a first conductivity type.

The first conductivity type may include an N type.

The diffusion prevention film may be defined by nitride in an upper portion of the diffusion film.

The work function adjustment film of the first conductivity type may include a first metal and a second metal, the first metal being the first diffusion material, the second metal being different from the first metal, and a composition ratio of the first metal to the second metal is about 2:1 to about 10:1.

The first metal may include Al, and the second metal may include Ti.

According to embodiments, there is also provided a semiconductor device, including an interlayer insulating film on a substrate, the interlayer insulating film including a first trench and a second trench, an etch stop film in the first trench and the second trench, a work function adjustment film of a second conductivity type only on the etch stop film in the second trench, the work function adjustment film of the second conductivity type including a diffusion material, a work function adjustment film of a first conductivity type on the etch stop film in the first trench, the work function adjustment film of the first conductivity type including the diffusion material, a gate metal structure on the work function adjustment film of the first conductivity type, the gate metal structure including a same diffusion material as the diffusion material in the work function adjustment film of the first conductivity type, and a diffusion prevention film between the gate metal structure and the work function adjustment film of the first conductivity type, the diffusion prevention film being configured to prevent diffusion of the diffusion material from the gate metal structure to a lower part of the first trench, wherein the diffusion material diffused from the work function adjustment film of the first conductivity type exists in the etch stop film in the first trench.

The semiconductor device may further include a gate insulating film under the etch stop film, the diffusion material diffused from the work function adjustment film of the first conductivity type existing in the gate insulating film.

In the first trench, a content of the diffusion material in the work function adjustment film of the first conductivity type may be greater than that of the diffusion material in the etch stop film, and the content of the diffusion material in the etch stop film may be greater than that of the diffusion material in the gate insulating film.

The work function adjustment film of the first conductivity type may include a first metal, which is the diffusion material, and a second metal, which is different from the first metal, a composition ratio of the first metal to the second metal may be about 2:1 to about 10:1.

The diffusion prevention film may be defined by nitride in an upper portion of the work function adjustment film of the first conductivity type.

According to embodiments, there is also provided a semiconductor device, including an interlayer insulating film on a substrate, the interlayer insulating film including a trench, a gate insulating film in the trench, a diffusion film on the gate insulating film, the diffusion film including a first diffusion material, a gate metal structure on the diffusion film, the gate metal structure including a second diffusion material, and a diffusion prevention film between the gate metal structure and the diffusion film, the diffusion prevention film being configured to prevent diffusion of the second diffusion material from the gate metal structure, wherein the second diffusion material is only in the gate metal structure among the interlayer insulating film, the gate insulating film, the diffusion film, and the gate metal structure, and wherein the first diffusion material is at least in the diffusion film and in the gate insulating film.

An amount of the first diffusion material may decrease as a distance from the diffusion film increases, the distance from the diffusion film being measured in a direction oriented from the diffusion film toward a surface of the trench.

The diffusion prevention film may include at least one of TiN, TaN, WN, and TiAlN.

The first diffusion material may be aluminum and the second diffusion material is aluminum or tungsten.

The diffusion prevention film may have a thickness of about 5 Å to about 50 Å.

BRIEF DESCRIPTION OF THE DRAWINGS

Features will become apparent to those of ordinary skill in the art by describing in detail exemplary embodiments with reference to the attached drawings in which.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to the embodiments set forth herein. Rather, these embodiments are provided so that this disclosure will be thorough and complete and will fully convey the inventive concept to those skilled in the art, and embodiments will only be defined by the appended claims.

It will be understood that when an element or layer is referred to as being "connected to" or "coupled to" another element or layer, it can be directly on or connected to the other element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the embodiments.

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
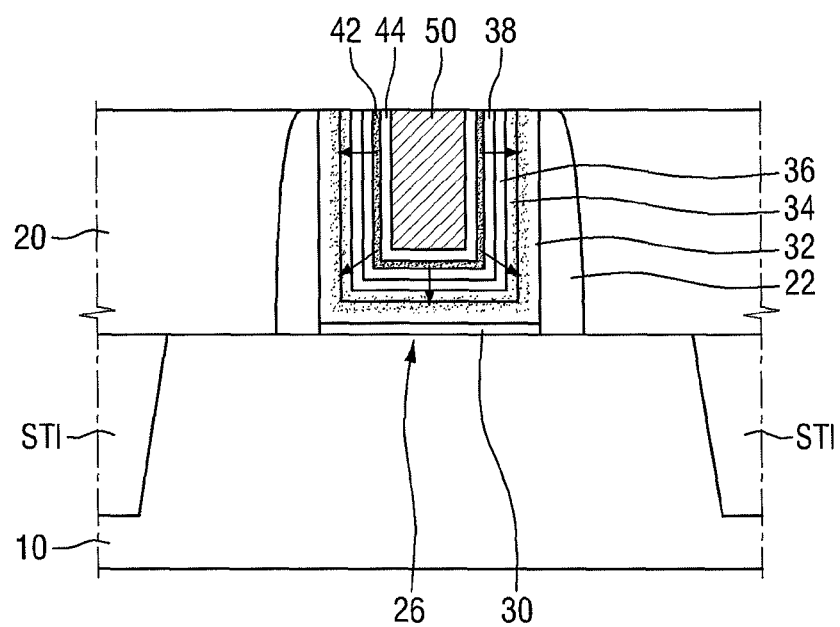
FIG. 1 illustrates a cross-sectional view of a semiconductor device according to a first embodiment.

FIG. 1 is a cross-sectional view of a semiconductor device according to a first embodiment.

Referring to FIG. 1, the semiconductor device according to the first embodiment may include a substrate 10 and an interlayer insulating film 20 which includes a trench 26. Further, an interface film 30, a gate insulating film 32, a capping film 34, an etch stop film 36, a work function adjustment film 38 of a first conductivity type, a diffusion film 42, a diffusion prevention film 44, and a gate metal structure 50 are formed in the trench 26.

A device isolation film, e.g., shallow trench isolation (STI), may be formed in the substrate 10 to define an active region. The substrate 10 may be made of one or more semiconductor materials, e.g., at least one of Si, Ge, SiGe, GaP, GaAs, SiC, SiGeC, InAs, and InP. The substrate 10 may also be a silicon-on-insulator (SOI) substrate.

The interlayer insulating film 20 may be formed on the substrate 10 and may include the trench 26. For example, the interlayer insulating film 20 may be formed by stacking two or more insulating films. As shown in the drawing, a spacer 22 may be formed on sidewalls of the trench 26, and the substrate 10 may define, e.g., may be disposed on, a bottom surface of the trench 26. However, embodiments are not limited thereto. The spacer 22 may include, e.g., at least one of a nitride film and an oxynitride film. For example, unlike the illustration in FIG. 1, the spacer 22 may be L-shaped.

The interface film 30 may be formed along the bottom surface of the trench 26. The interface film 30 may prevent a poor interface between the substrate 10 and the gate insulating film 32. The interface film 30 may include a low-k material layer with a dielectric constant (k) of 9 or less, e.g., a silicon oxide film with a dielectric constant of about 4 or a silicon oxynitride film with a dielectric constant of about 4 to about 8 according to the content of oxygen atoms and nitrogen atoms. Alternatively, the interface film 30 may be made of silicate or a combination of the above example films.

The gate insulating film 32 may be conformally formed along the sidewalls and bottom surface of the trench 26. The gate insulating film 32 may contain a high-k material having a higher dielectric constant than a silicon oxide film. For example, the gate insulating film 32 may contain at least one of HfSiON, HfO$_2$, ZrO$_2$, Ta$_2$O$_5$, TiO$_2$, SrTiO$_3$, and (Ba,Sr)TiO$_3$. The gate insulating film 32 may be formed to an appropriate thickness according to the type of a device to be formed.

The capping film 34 may be formed on the gate insulating film 32 in the trench 26. As shown in the drawing, the capping film 34 may be conformally formed along the sidewalls and bottom surface of the trench 26. The capping film 34 may contain, e.g., TiN, and may be formed to an appropriate thickness according to the type of a device to be formed. For example, the capping film 34 may be formed to a thickness of about 5 Å to about 30 Å.

The etch stop film 36 may be formed on the capping film 34 in the trench 26. As shown in the drawing, the etch stop film 36 may be conformally formed along the sidewalls and bottom surface of the trench 26. The etch stop film 36 may contain, e.g., TaN. The etch stop film 36 may be used when a work function adjustment film 60 of a second conductivity type, which is formed in another region and is unnecessary, is etched (see FIG. 4). The etch stop film 36 may be formed to an appropriate thickness according to the type of a device to be formed. For example, the etch stop film 36 may be formed to a thickness of about 5 Å to about 30 Å. The etch stop film 36 may be needed when a work function adjustment film of the second conductivity type (see FIGS. 4 and 5) is formed. This will be described later.

In FIG. 1, the capping film 34 and the etch stop film 36 are separated from each other, e.g., the capping film 34 and the etch stop film 36 are individual and separate films formed of different material on top of each other. However, the capping film 34 and the etch stop film 36 may also be combined into a single film. In this case, e.g., the single film may contain at least one of TiN and TaN.

The work function adjustment film 38 may be formed on the etch stop film 36 in the trench 26. In other words, the work function adjustment film 38 may be formed under the diffusion film 42. As shown in the drawing, the work function adjustment film 38 may be conformally formed along the sidewalls and bottom surface of the trench 26. The work function adjustment film 38 may have the first conductivity type, e.g., an N type. The work function adjustment film 38 may control operating characteristics of a transistor by adjusting a work function of the transistor. The work function adjustment film 38 may be a material selected from TiAl, TiAlN, TaC, TiC, and HfSi, and may contain a first diffusion material contained in the diffusion film 42, which will be described later. The work function adjustment film 38 may be formed to a thickness of, but not limited to, about 50 Å to about 150 Å.

The diffusion film 42 may be formed on the work function adjustment film 38 in the trench 26. As shown in the drawing, the diffusion film 42 may be conformally formed along the sidewalls and bottom surface of the trench 26. The diffusion film 42 may contain the first diffusion material and may be needed to diffuse the first diffusion material. As shown in the drawing, the first diffusion material diffused from the diffusion film 42 may exist in and/or on the gate insulating film 32. The first diffusion material existing in and/or on the gate insulating film 32 may lower a threshold voltage (Vt) of the transistor, thereby improving the operating characteristics of the transistor. The first diffusion material may be, e.g., Al. The diffusion film 42 may be formed to an appropriate thickness according to the diffusion velocity of the first diffusion material, the diffusion amount of the first diffusion material, and the desired level of the threshold voltage. For example, the diffusion film 42 that contains the first diffusion material may be formed to a thickness of about 10 Å to about 100 Å.

The first diffusion material is diffused from the diffusion film 42 into and/or onto the gate insulating film 32 by heat treatment. Therefore, a content of the first diffusion material in the diffusion film 42 may be greater than that of the first diffusion material in the work function adjustment film 38 of the first conductivity type. The content of the first diffusion material in the work function adjustment 38 may be greater than that of the first diffusion material in the etch stop film 36. The content of the first diffusion material in the etch stop film 36 may be greater than that of the first diffusion material in the capping film 34. The content of the first diffusion material in the capping film 34 may be greater than that of the first diffusion material in the gate insulating film 32. That is, the content of the first diffusion material may be reduced in the order of the work function adjustment film 38 of the first conductivity type, the etch stop film 36, the capping film 34, and the gate insulating film 32.

The gate metal structure 50 may be formed on the diffusion film 42 in the trench 26 to fill the trench 26. The gate metal structure 50 may contain a second diffusion material. For example, the second diffusion material may be, but is not limited to, Al or W. The second diffusion material may be the same material as the first diffusion material.

The diffusion prevention film 44 may be formed between the gate metal structure 50 and the diffusion film 42. As shown in the drawing, the diffusion prevention film 44 may be conformally formed along the, e.g., entire length of, sidewalls and bottom surface of the trench 26. The diffusion prevention film 44 prevents the diffusion of the second diffusion material out of the gate metal structure 50.

If the diffusion prevention film 44 is not present, the second diffusion material may diffuse out of the gate metal structure 50 into and/or onto the gate insulating film 32, thereby affecting the threshold voltage of the transistor. However, since it is difficult to adjust the diffusion amount and velocity of the second diffusion material contained in the gate metal structure 50, a desired threshold voltage cannot be obtained. For this reason, the diffusion prevention film 44 is formed to prevent the diffusion of the second diffusion material out of the gate metal structure 50, whereas the first diffusion material, i.e., whose diffusion velocity and amount can be adjusted easily, diffuses from the diffusion film 42 into and/or onto the gate insulating film 32. In other words, the second diffusion material contained in the gate metal structure 50 is blocked by the diffusion prevention film 44 from diffusing into and/or onto the gate insulating film 32, while the first diffusion material contained in the diffusion film 42 diffuses into and/or onto the gate insulating film 32 to adjust the threshold voltage of the transistor.

The diffusion prevention film 44 may be formed to a thickness of, e.g., about 5 Å to about 50 Å. In addition, the diffusion prevention film 44 may be made of a material such as, e.g., TiN, TaN, WN, or TiAlN. However, embodiments are not limited thereto.

Figure 2:
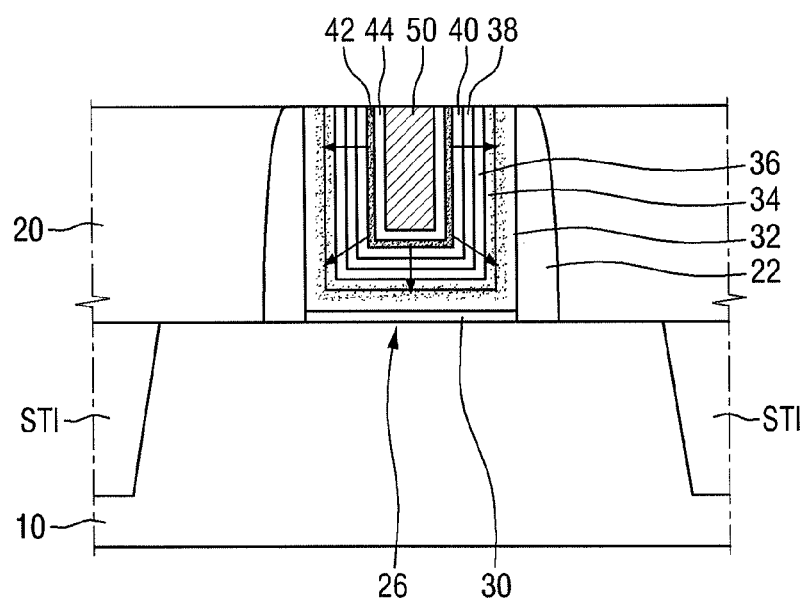
FIG. 2 illustrates a cross-sectional view of a semiconductor device according to a second embodiment.

FIG. 2 is a cross-sectional view of a semiconductor device according to a second embodiment. Any repetitive description of elements identical to those of FIG. 1 will be omitted, and the following description will focus on differences relative to FIG. 1.

Referring to FIG. 2, the semiconductor device according to the second embodiment may further include a diffusion control film 40. The diffusion control film 40 may be formed under the diffusion film 42. Specifically, the diffusion control film 40 may be formed between the diffusion film 42 and the work function adjustment film 38. The diffusion control film 40 may be conformally formed along the sidewalls and bottom surface of the trench 26. The diffusion control film 40 is formed to adjust the diffusion amount and velocity of the first diffusion material from the diffusion film 42 more easily. Specifically, the first diffusion material contained in the diffusion film 42 passes through the diffusion control film 40 to diffuse into and/or onto the gate insulating film 32. Therefore, the time required for the first diffusion material to diffuse into and/or onto the gate insulating film 32 can be controlled by adjusting a thickness of the diffusion adjustment film 40. In addition, the amount of the first diffusion material that diffuses into and/or onto the gate insulating film 32 can be controlled by adjusting the thickness of the diffusion adjustment film 40. The diffusion control film 40 may contain, e.g., Ti, and may be formed to a thickness of about 5 Å to about 15 Å.

Figure 3:
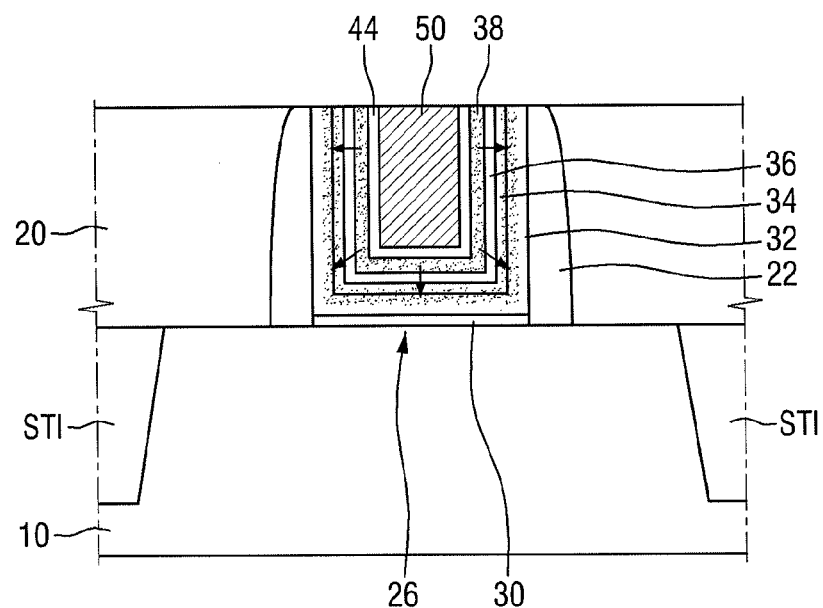
FIG. 3 illustrates a cross-sectional view of a semiconductor device according to a third embodiment.

FIG. 3 is a cross-sectional view of a semiconductor device according to a third embodiment. For simplicity, any repetitive description of elements identical to those of the first embodiment will be omitted.

Referring to FIG. 3, unlike the semiconductor device of FIG. 1, the semiconductor device according to the third embodiment does not include a diffusion film (indicated by reference numeral 42 in FIG. 1). Instead, the work function adjustment film 38 may serve as the diffusion film (42 in FIG. 1). That is, the work function adjustment film 38 may be the diffusion film (42 in FIG. 1). The work function adjustment film 38 may have a first conductivity type, e.g., an N type.

Since the work function adjustment film 38 serves as the diffusion film, it may contain a first diffusion material. Specifically, the work function adjustment film 38 may contain a first metal, which is the first diffusion material, and a second metal, which is different from the first metal. The first metal contained in the work function adjustment film 38 may diffuse into and/or onto the gate insulating film 32, thereby adjusting a threshold voltage of a transistor. To facilitate the diffusion of the first metal, the work function adjustment film 38 should contain a sufficient amount of the first metal. Therefore, the first metal may be contained in the work function adjustment film 38 in a greater amount than the second metal. If a composition ratio of the first metal to the second metal is about 2:1 or greater, the threshold voltage of the transistor can be adjusted easily even without the diffusion film.

In addition, since the work function adjustment film 38 controls operating characteristics of the transistor by adjusting a work function of the transistor, if the composition ratio of the first metal to the second metal is about 10:1 or less, the work function adjustment film 38 may serve as a work function adjustment film, and the first metal contained in the work function adjustment film 38 may easily diffuse through the etch stop film 36. The first metal diffuses from the work function adjustment film 38 to the gate insulating film 32. Therefore, a first metal content of the work function adjustment film 38 may be greater than that of the capping film 34, and the first metal content of the capping film 34 may be greater than that of the gate insulating film 32. That is, the first metal content may be reduced in the order of the work function adjustment film 38, the capping film 34, and the gate insulating film 32. Here, the first metal may be, e.g., Al, and the second metal may be, e.g., Ti.

In the second embodiment, the diffusion prevention film 44 may be formed as a separate element on the work function adjustment film 38. However, the diffusion prevention film 44 can also be formed by nitriding an upper portion of the work function adjustment film 38. Specifically, a top surface of the work function adjustment film 38 may be nitrided by providing a $NH_3$, $N_2H_4$, or $N_2$ gas to the work function adjustment film 38, followed by heating the work function adjustment film 38, or by using plasma, e.g., $NH_3$, $N_2H_4$, or $N_2$ gas. When plasma is used, the top surface of the work function adjustment film 38 may be nitrided at a low temperature. However, embodiments are not limited thereto, and the top surface of the work function adjustment film 38 may also be nitrided using other methods. Here, the nitrided work function adjustment film formed on the top surface of the work function adjustment film 38 may serve as the diffusion prevention film 44 described above.

Figure 4:
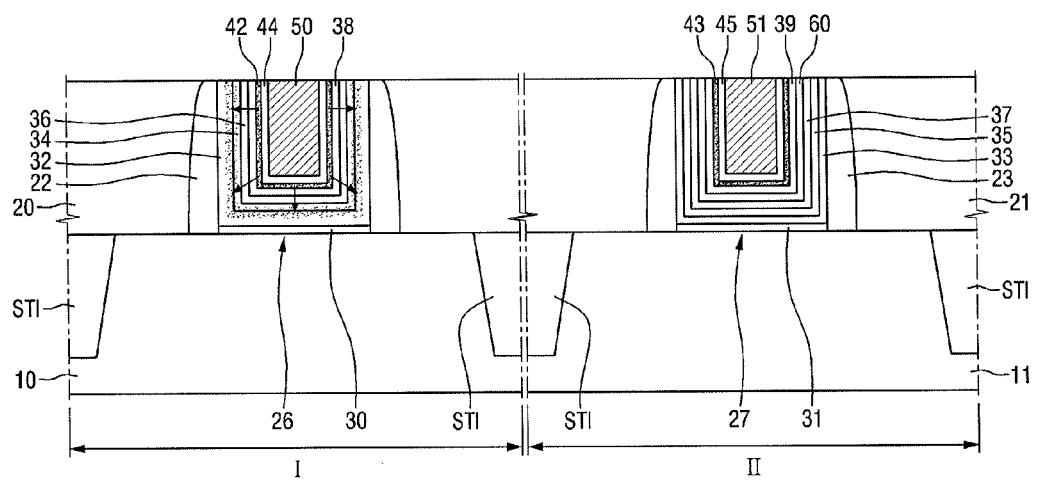
FIG. 4 illustrates a cross-sectional view of a semiconductor device according to a fourth embodiment.

FIG. 4 is a cross-sectional view of a semiconductor device according to a fourth embodiment. For simplicity, the following description will focus on differences relative to the embodiment of FIG. 1.

Referring to FIG. 4, in the semiconductor device according to the fourth embodiment, a first region I and a second region II are defined in a substrate 10 and a substrate 11, respectively. For example, an N-type transistor may be formed in the first region I, and a P-type transistor may be formed in the second region II.

Interlayer insulating films 20 and 21 may be formed on the substrates 10 and 11, respectively. The interlayer insulating films 20 and 21 may include the first trench 26 located in the first region I and a second trench 27 located in the second region II. A spacer 22 may be formed on sidewalls of the first trench 26, and a spacer 23 may be formed on sidewalls of the second trench 27. The first region I is identical to the semiconductor device of FIG. 1, and thus a description thereof will be omitted.

Referring to FIG. 4, the semiconductor device according to the fourth embodiment may include, in the second region II, the substrate 11, the interlayer insulating film 21 which includes the second trench 27, and an interface film 31, a gate insulating film 33, a capping film 35, an etch stop film 37, a work function adjustment film 39 of a first conductivity type, a diffusion film 43, a diffusion prevention film 45, and a gate metal structure 51, which are formed in the second trench 27. The above structure of the second region II is identical to that of the first region I.

Unlike the first region I, the second region II may further include a work function adjustment film 60 of a second conductivity type. The work function adjustment film 60 of the second conductivity type may be located between the etch stop film 37 and the work function adjustment film 39 of the first conductivity type, and may be conformally formed along sidewalls and a bottom surface of the second trench 27. For example, the work function adjustment film 39 of the first conductivity type may include an N-type work function adjustment film, and the work function adjustment film 60 of the second conductivity type may include a P-type work function adjustment film. For example, the work function adjustment film 39 of the first conductivity type may be a TiAl film, and the work function adjustment film 60 of the second conductivity type may be a TiN film. Due to the work function adjustment film 60 of the second conductivity type, operating characteristics of the transistor in the second region II may be different from those of the transistor in the first region I.

The work function adjustment film 60 of the second conductivity type may prevent the diffusion of a diffusion material. Specifically, in the first region I, a diffusion material contained in the diffusion film 42 may diffuse through an etch stop film, e.g., may diffuse into and/or onto the gate insulating film 32. However, in the second region II, the diffusion of a diffusion material contained in the diffusion film 43 is blocked by the work function adjustment film 60 of the second conductivity type.

Figure 5:
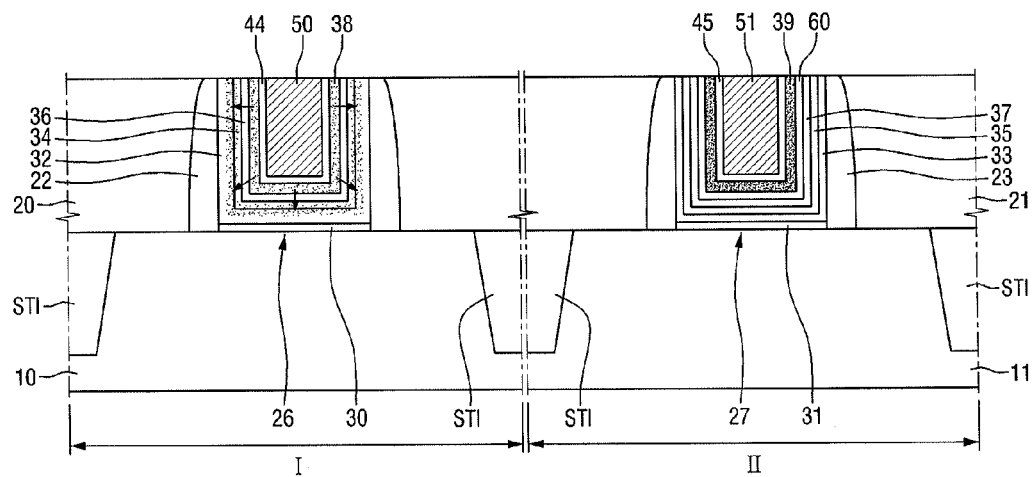
FIG. 5 illustrates a cross-sectional view of a semiconductor device according to a fifth embodiment.

FIG. 5 is a cross-sectional view of a semiconductor device according to a fifth embodiment. For simplicity, the following description will focus on differences relative to the embodiment of FIG. 4.

Referring to FIG. 5, unlike the semiconductor device of FIG. 4, the semiconductor device according to the fifth embodiment does not include a diffusion film (indicated by reference numerals 42 and 43 in FIG. 4). Instead, the work function adjustment films 38 and 39 of a first conductivity type may contain a diffusion material, and the diffusion material may diffuse through the etch stop film 36. Specifically, in the first region I, the diffusion material may diffuse from the work function adjustment film 38 of the first conductivity type into and/or onto a gate insulating film 32 formed under the etch stop film 36. In the second region II, the work function adjustment film 60 of a second conductivity type blocks the diffusion of the diffusion material. Therefore, the diffusion material contained in the work function adjustment film 39 of the first conductivity type does not diffuse through the etch stop film 37. As in FIG. 3, the work function adjustment films 38 and 39 of the first conductivity type may contain a first metal, which is the diffusion material, and a second metal, which is different from the first metal, and a composition ratio of the first metal to the second metal may be about 2:1 to 10:1. Diffusion prevention films 44 and 45 may be formed by nitriding upper portions of the work function adjustment films 38 and 39 of the first conductivity type.

Figure 6:
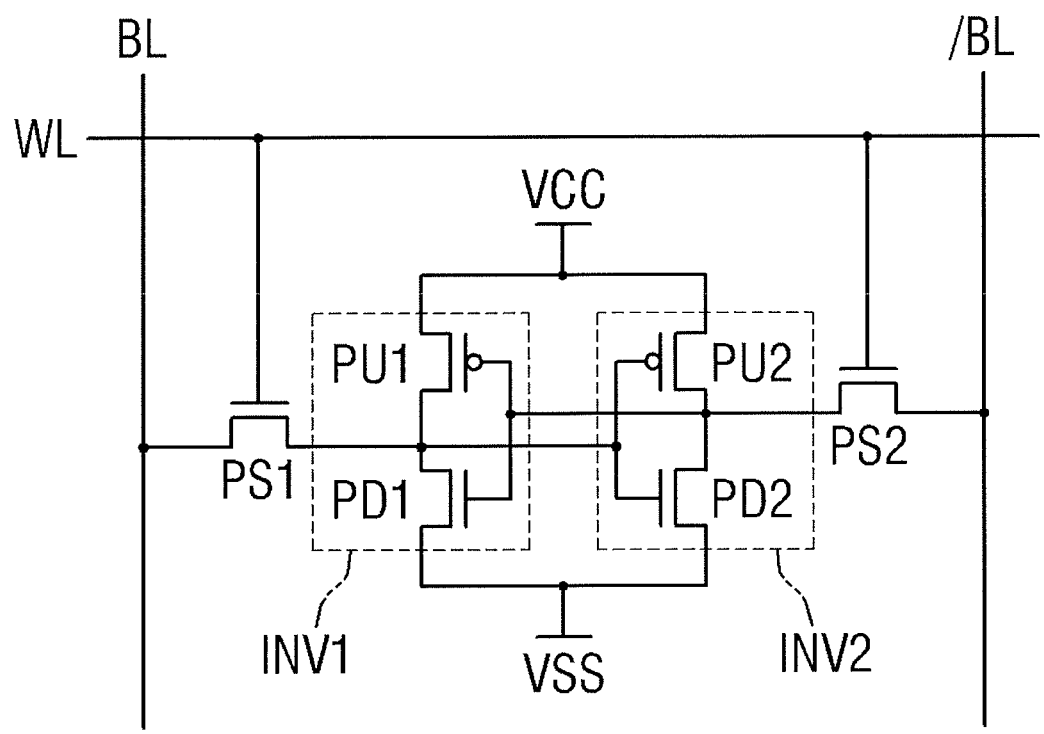
FIGS. 6 and 7 illustrate respectively circuit and layout diagrams of a semiconductor device according to a sixth embodiment.
Figure 7:
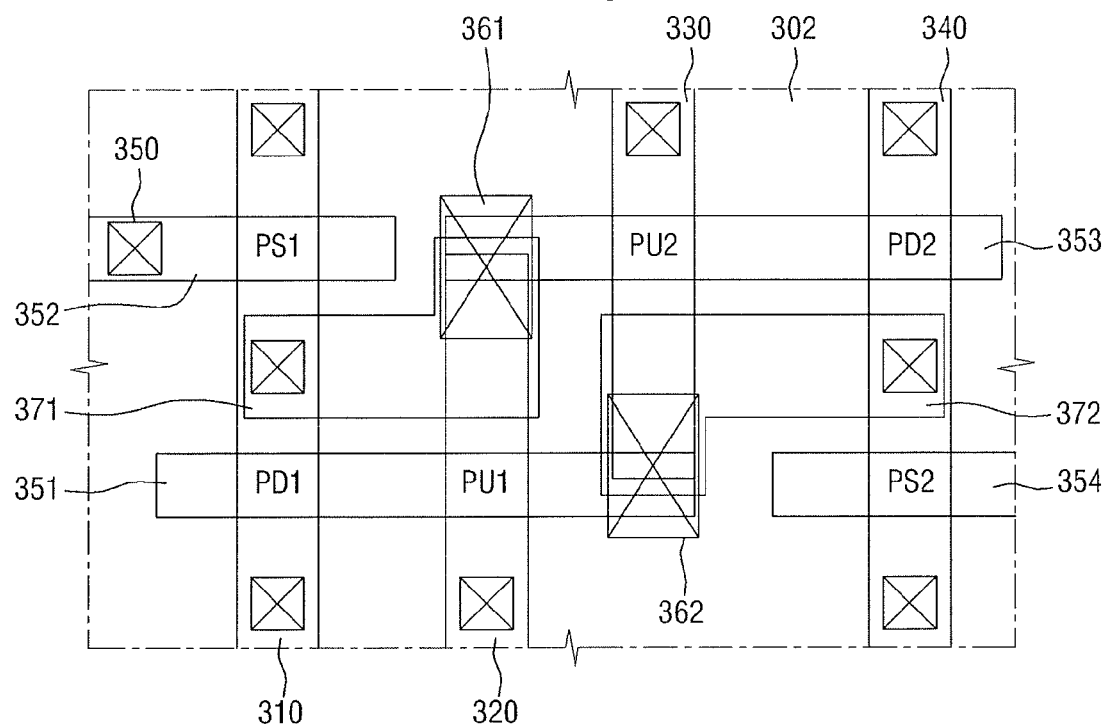

FIGS. 6 and 7 are circuit and layout diagrams, respectively, of a semiconductor device according to a sixth embodiment.

Referring to FIGS. 6 and 7, the semiconductor device 9 according to the sixth embodiment may include a pair of inverters INV1 and INV2 connected in parallel between a power supply node Vcc and a ground node Vss, and first and second pass transistors PS1 and PS2 connected respectively to output nodes of the inverters INV1 and INV2. The first pass transistor PS1 and the second pass transistor PS2 may be connected to a bit line BL and a complementary bit line /BL, respectively. A gate of the first pass transistor PS1 and a gate of the second pass transistor PS2 may be connected to a word line WL.

The first inverter INV1 includes a first pull-up transistor PU1 and a first pull-down transistor PD1 connected in series to each other, and the second inverter INV2 includes a second pull-up transistor PU2 and a second pull-down transistor PD2 connected in series to each other. The first pull-up transistor PU1 and the second pull-up transistor PU2 may be PMOS transistors, and the first pull-down transistor PD1 and the second pull-down transistor PD2 may be NMOS transistors.

In addition, an input node of the first inverter INV1 is connected to the output node of the second inverter INV2, and an input node of the second inverter INV2 is connected to the output node of the first inverter INV1, so that the first inverter INV1 and the second inverter INV2 form one latch circuit.

Referring to FIGS. 6 and 7, first through fourth active regions 310 through 340 are separated from each other and extend in a direction (e.g., a vertical direction in FIG. 7). The second active region 320 and the third active region 330 may be shorter than the first active region 310 and the fourth active region 340.

In addition, first through fourth gate electrodes 351 through 354 extend in the other direction (e.g., a horizontal direction in FIG. 7) and intersect the first through fourth active regions 310 through 340. Specifically, the first gate electrode 351 may completely intersect the first active region 310 and the second active region 320, and may overlap an end of the third active region 330. The third gate electrode 353 may completely intersect the fourth active region 340 and the third active region 330, and may overlap an end of the second active region 320. The second gate electrode 352 and the fourth gate electrode 354 intersect the first active region 310 and the fourth active region 340, respectively.

As shown in the drawings, the first pull-up transistor PU1 is defined around a region in which the first gate electrode 351 intersects the second active region 320, the first pull-down transistor PD1 is defined around a region in which the first gate electrode 351 intersects the first active region 310, and the first pass transistor PS1 is defined around a region in which the second gate electrode 352 intersects the first active region 310. The second pull-up transistor PU2 is defined around a region in which the third gate electrode 353 intersects the third active region 330, the second pull-down transistor PD2 is defined around a region in which the third gate electrode 353 intersects the fourth active region 340, and the second pass transistor PS2 is defined around a region in which the fourth gate electrode 354 intersects the fourth active region 340.

Although not shown clearly, a source/drain may be formed on both sides of each of the regions in which the first through fourth gate electrodes 351 through 354 intersect the first through fourth active regions 310 through 340. Also, a plurality of contacts 350 may be formed.

Furthermore, a shared contact 361 connects all of the second active region 320, a third gate electrode 353, and a wiring 371. Another shared contact 362 connects all of the third active region 330, the first gate electrode 351, and a wiring 372.

The first pull-up transistor PU1 and the second pull-up transistor PU2 may be configured in the same way as any one of the second regions II of FIGS. 4 and 5, and the first pull-down transistor PD1, the first pass transistor PS1, the second pull-down transistor PD2, and the second pass transistor PS2 may be configured in the same way as any one of FIGS. 1 through 3.

Figure 8:
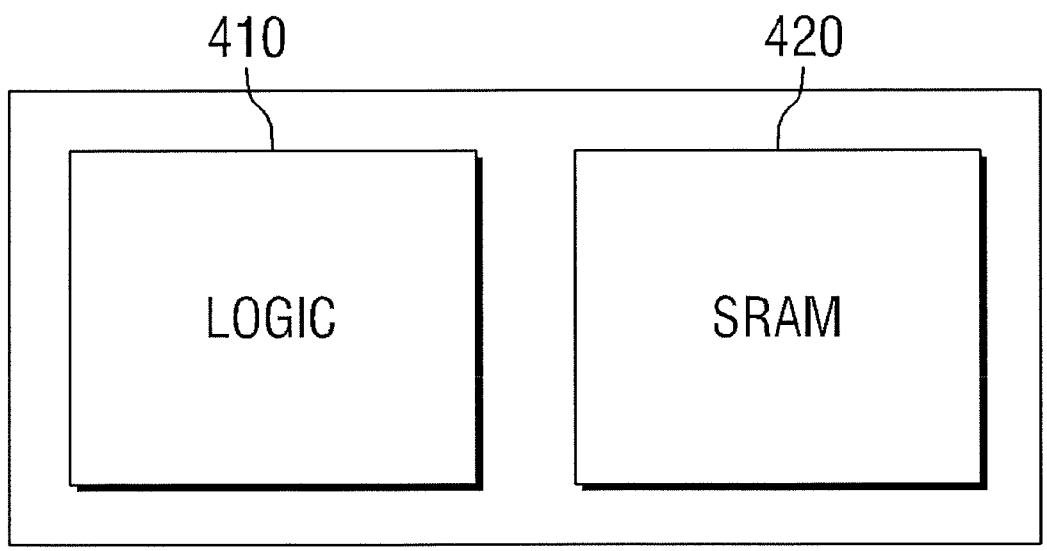
FIG. 8 illustrates a block diagram of a semiconductor device according to a seventh embodiment.

FIG. 8 is a block diagram of a semiconductor device according to a seventh embodiment.

Referring to FIG. 8, the semiconductor device according to the seventh embodiment may include a logic region 410 and a static random access memory (SRAM) region 420. The structures described above with reference to FIGS. 1 through 5 may be applied to the logic region 410 but may not be applied to the SRAM region 420.

Alternatively, the structures described above with reference to FIGS. 1 through 5 may be applied to both the logic region 410 and the SRAM region 420. In yet another alternative, the structures described above with reference to FIGS. 1 through 5 may be applied to the SRAM region 420 but may not be applied to the logic region 410.

In FIG. 8, the logic region 410 and the SRAM region 420 are illustrated as an example. However, embodiments not limited to this example, e.g., embodiments may be applied to DRAM, MRAM, RRAM, and PRAM from the logic region 410.

Figure 9:
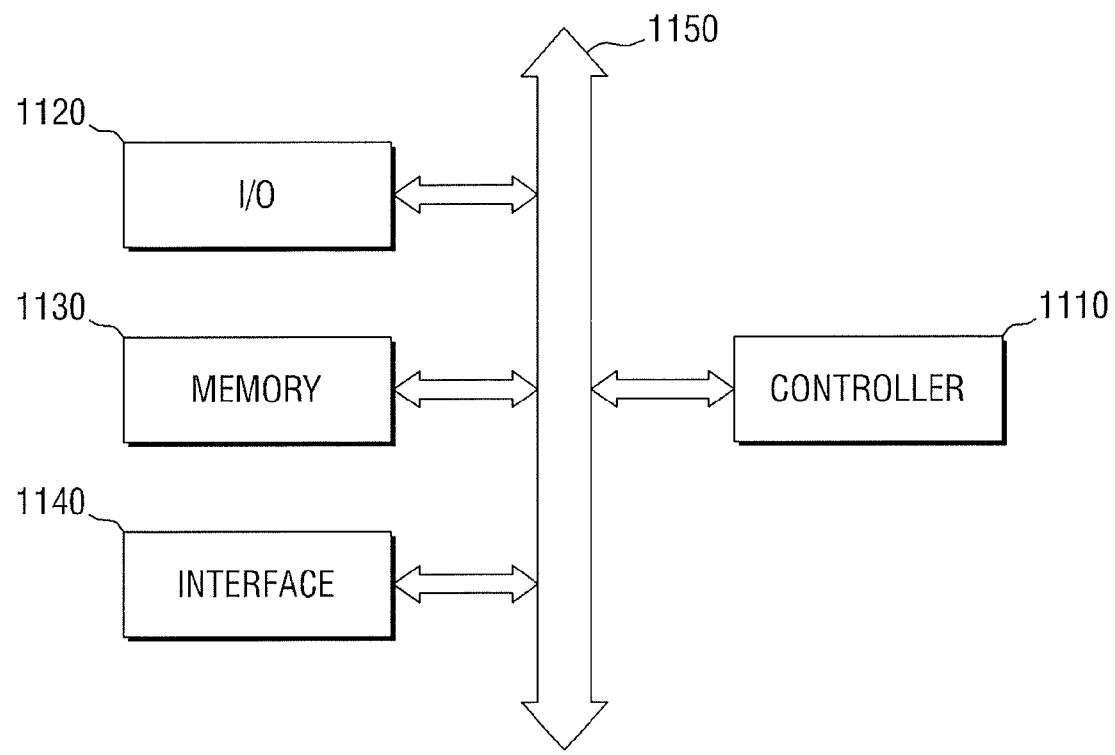
FIG. 9 illustrates a block diagram of an electronic system including semiconductor devices according to some embodiments.

FIG. 9 is a block diagram of an electronic system 1100 including semiconductor devices according to some embodiments.

Referring to FIG. 9, the electronic system 1100 according to an embodiment may include a controller 1110, an input/output (I/O) device 1120, a memory device 1130, an interface 1140, and a bus 1150. The controller 1110, the I/O device 1120, the memory device 1130, and/or the interface 1140 may be coupled to each other through the bus 1150. The bus 1150 corresponds to a path through which data transfer.

The controller 1110 may include, e.g., at least one of a microprocessor, a digital signal processor, a microcontroller, and logic devices capable of performing similar functions to those of the above elements. The I/O device 1120 may include, e.g., a keypad, a keyboard, and a display device. The memory device 1130 may store data and/or commands. The interface 1140 may transmit data to a communication network or receive data from the communication network. The interface 1140 can be in a wired or wireless form. For example, the interface 1140 may be an antenna or a wire/wireless transceiver. Although not shown in the drawing, the electronic system 1100 may further include a high-speed DRAM and/or a high-speed SRAM as an operation memory for improving the operation of the controller 1110. The semiconductor devices according to the above embodiments may be provided within the memory device 1130 or provided as a part of the controller 1110 or the I/O device 1120.

The electronic system 1100 can be applied to a personal digital assistant (PDA), a portable computer, a web tablet, a wireless phone, a mobile phone, a digital music player, a memory card, and all electronic products that can transmit and/or receive information in a wireless environment.

Figure 10:
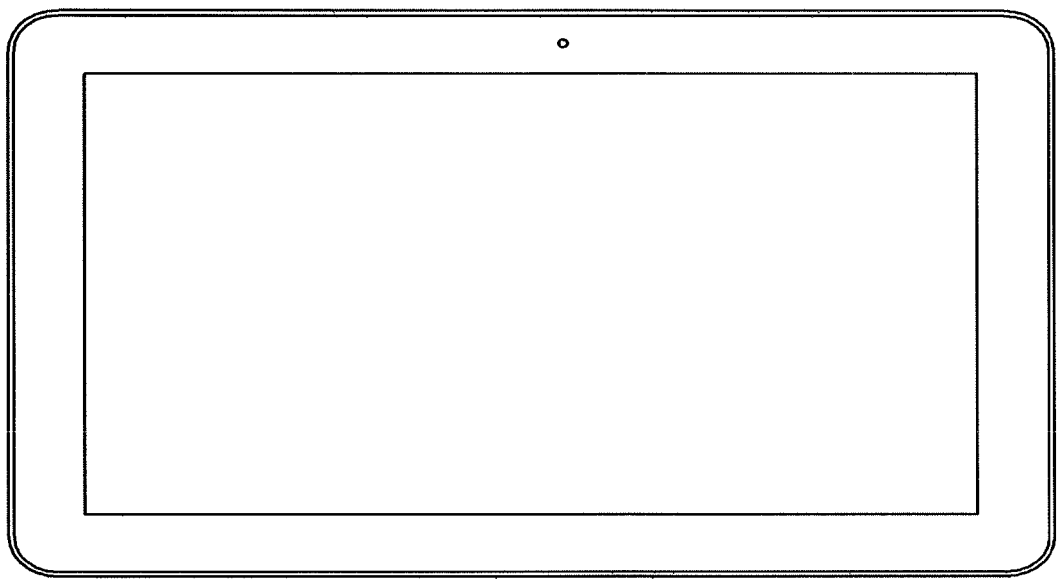
FIGS. 10 and 11 illustrate exemplary semiconductor systems to which semiconductor devices according to some embodiments are applied.
Figure 11:
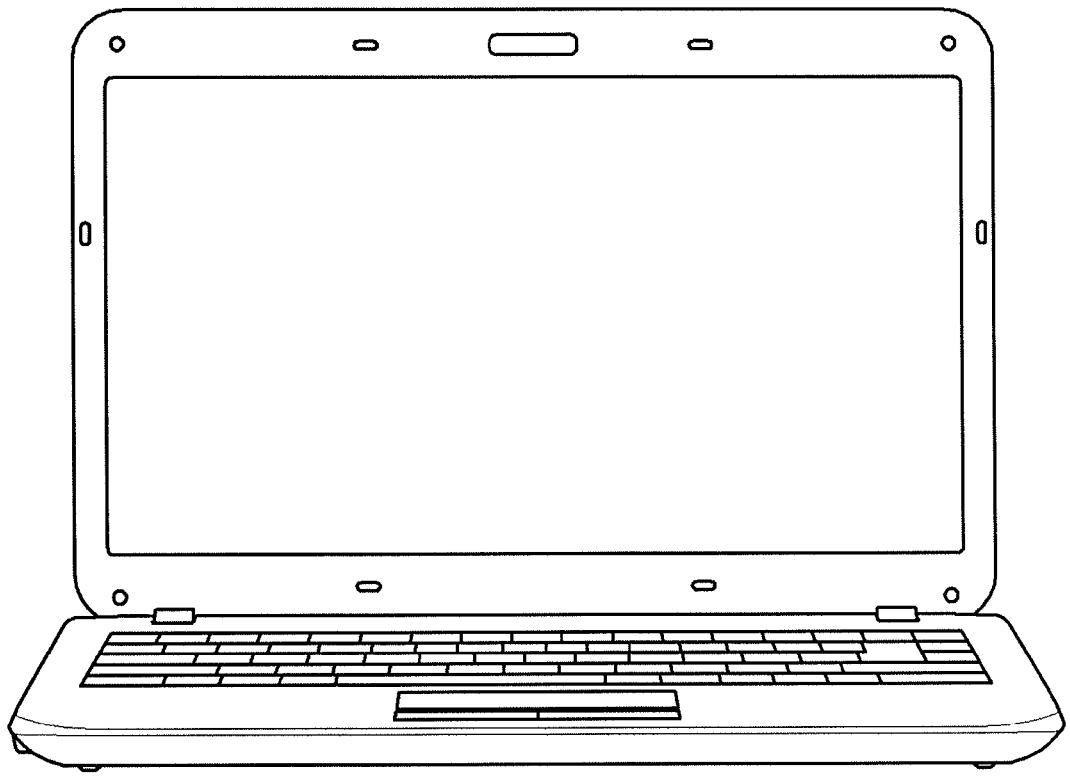

FIGS. 10 and 11 are exemplary semiconductor systems to which semiconductor devices according to some embodiments can be applied. FIG. 10 shows a tablet PC, and FIG. 11 shows a notebook computer. At least one of the semiconductor devices according to the first through fifth embodiments may be used in a table PC, a notebook computer, and the like. It is obvious to those of ordinary skill in the art that the semiconductor devices according to embodiments are also applicable to other integrated circuit devices not shown in the drawings.

A method of fabricating a semiconductor device according to the fourth embodiment will now be described with reference to FIGS. 4 and 12-16. For simplicity, any repetitive description of elements and features described above will be omitted. FIGS. 12 through 16 are views illustrating intermediate processes in a method of fabricating a semiconductor device according to the fourth embodiment.

Figure 12:
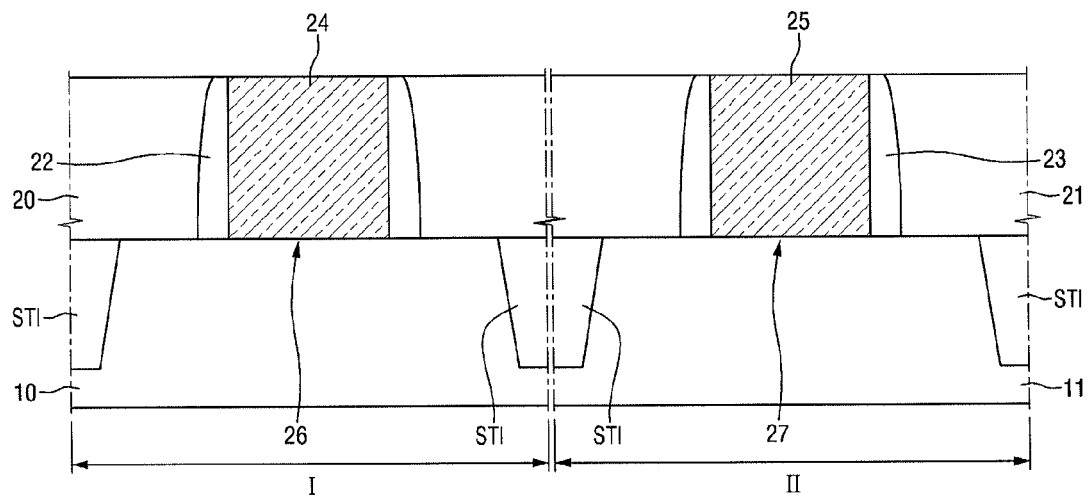
FIGS. 12 through 16 illustrate views of stages in a method of fabricating a semiconductor device according to a fourth embodiment.

Referring to FIG. 12, the substrates 10 and 11, in which the first region I and the second region II are defined, are provided. A first sacrificial gate 24 is formed in the first region I, and a first spacer 22 is formed on sidewalls of the first sacrificial gate 24. The first interlayer insulating film 20 surrounds the first sacrificial gate 24 and the first spacer 22 and exposes a top surface of the first sacrificial gate 24. A second sacrificial gate 25 is formed in the second region II, and a second spacer 23 is formed on sidewalls of the second sacrificial gate 25. The second interlayer insulating film 21 surrounds the second sacrificial gate 25 and the second spacer 23 and exposes a top surface of the second sacrificial gate 25. The first sacrificial gate 24 and the second sacrificial gate 25 may be made of, but not limited to, polysilicon. A first trench 26 is formed in the first interlayer insulating film 20 of the first region I, and the second trench 27 is formed in the second interlayer insulating film 21 of the second region II.

Figure 13:
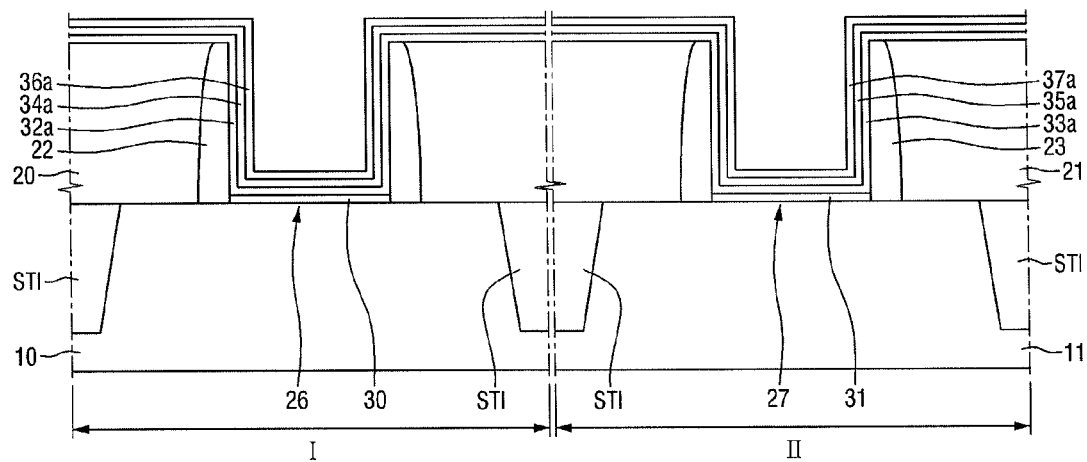

Referring to FIG. 13, the first sacrificial gate 24 and the second sacrificial gate 25 are removed. As a result, the first trench 26, which exposes a top surface of the substrate 10, is formed in the first interlayer insulating film 20 of the first region I, and the second trench 27, which exposes a top surface of the substrate 11, is formed in the second interlayer insulating film 21 of the second region II.

Next, the first interface film 30 may be formed on the top surface of the substrate 10 in the first trench 26, and the second interface film 31 may be formed on the top surface of the substrate 11 in the second trench 27. The first and second interface films 30 and 31 may be formed by oxidizing the top surface of the substrates 10 and 11. However, embodiments are not limited thereto.

A first gate insulating film 32a is formed in the first trench 26, and a second gate insulating film 33a is formed in the second trench 27. Specifically, the first gate insulating film 32a is conformally formed along a top surface of the first interlayer insulating film 20 and sidewalls and a bottom surface of the first trench 26. The second gate insulating film 33a is conformally formed along a top surface of the second interlayer insulating film 21 and sidewalls and a bottom surface of the second trench 27. The first gate insulating film 32a and the second gate insulating film 33a may be high-k films.

A first capping film 34a is formed on the first gate insulating film 32a in the first trench 26, and a second capping film 35a is formed on the second gate insulating film 33a in the second trench 27. The first capping film 34a and the second capping film 35a are also formed on the first interlayer insulating film 20 and the second interlayer insulating film 21, respectively.

A first etch stop film 36a is formed on the first capping film 34a in the first trench 26, and a second etch stop film 37a is formed on the second gate insulating film 37a in the second trench 27. The first etch stop film 36a and the second etch stop film 37a are also formed on the first interlayer insulating film 20 and the second interlayer insulating film 21, respectively.

Figure 14:
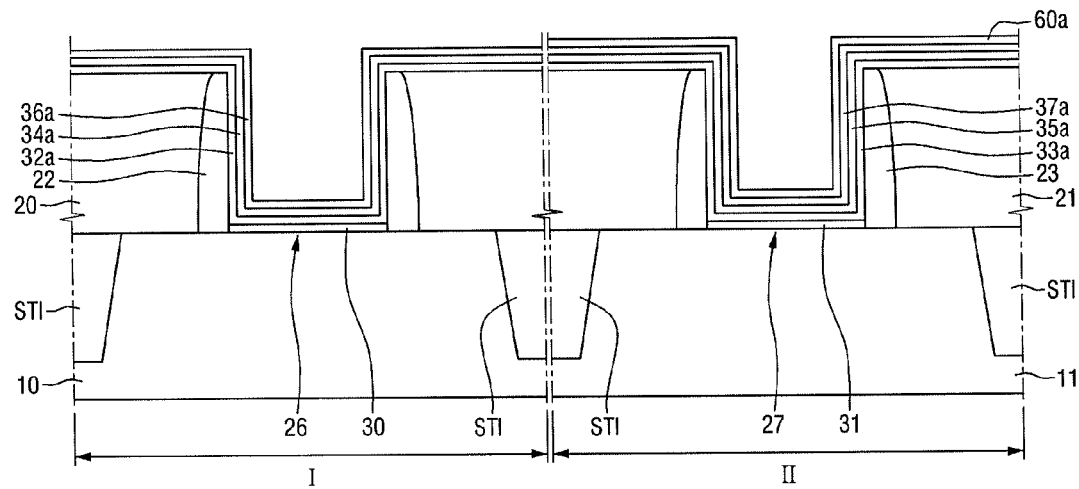

Referring to FIG. 14, a work function adjustment film 60a of a second conductivity type is formed on the second etch stop film 37a. As shown in the drawing, the work function adjustment film 60a of the second conductivity type is conformally formed along the top surface of the second interlayer insulating film 21 and the sidewalls and bottom surface of the second trench 27. Specifically, the work function adjustment film 60a of the second conductivity type may be formed on both the first etch stop film 36a and the second etch stop film 37a. In this case, the work function adjustment film 60a of the second conductivity type in the first region I may be removed by a photolithography process, an etching process, or the like. The resultant structure of the first region I may be as shown in FIG. 14. When the work function adjustment film 60a of the second conductivity type in the first region I is removed, the first gate insulating film 32a of the first region I should be protected, and the first etch stop film 36a protects the first gate insulting film 32a. Here, the second conductivity type may denote a P type, and the work function adjustment film 60a of the second conductivity type may be, e.g., a TiN film.

Figure 15:
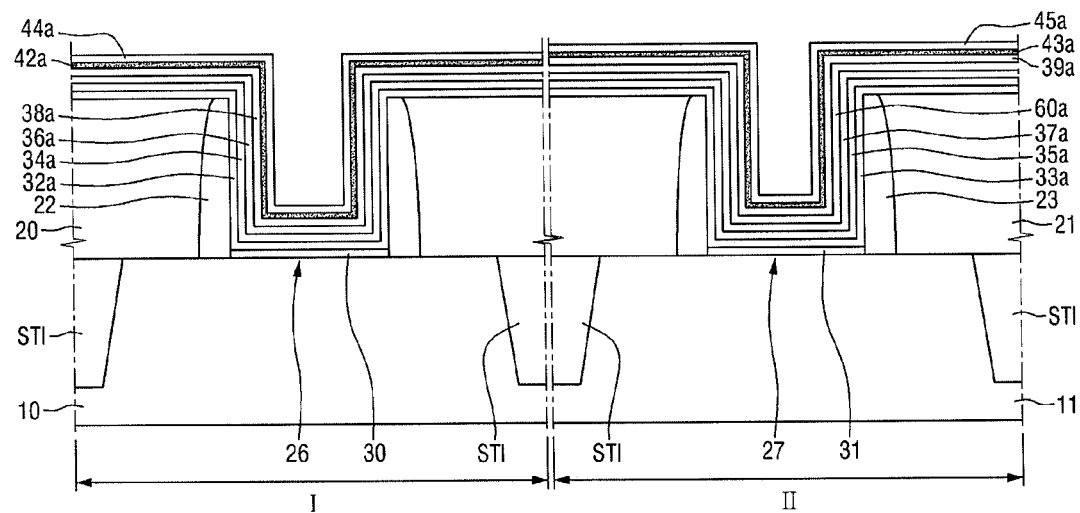

Referring to FIG. 15, a first work function adjustment film 38a of a first conductivity type is formed on the etch stop film 36a in the first trench 26, and a second work function adjustment film 39a of the first conductivity type is formed on the work function adjustment film 60a of the second conductivity type in the second trench 27. Specifically, the first work function adjustment film 38a of the first conductivity type is conformally formed along the top surface of the first interlayer insulating film 20 and the sidewalls and bottom surface of the first trench 26. The second work function adjustment film 39a of the first conductivity type is conformally formed along the top surface of the second interlayer insulating film 21 and the sidewalls and bottom surface of the second trench 27.

A first diffusion film 42a is formed on the first work function adjustment film 38a of the first conductivity type in the first trench 26, and a second diffusion film 43a is formed on the second work function adjustment film 39a of the first conductivity type in the second trench 27. Specifically, the first diffusion film 42a is conformally formed along the top surface of the first interlayer insulating film 20 and the sidewalls and bottom surface of the first trench 26. The second diffusion film 43a is conformally formed along the top surface of the second interlayer insulating film 21 and the sidewalls and bottom surface of the second trench 27. The first diffusion film 42a and the second diffusion film 43a contain a first diffusion material.

The first diffusion film 42a and the second diffusion film 43a may be formed by chemical vapor deposition (CVD) or atomic layer deposition (ALD). These methods are used to conformally form the first diffusion film 42a and the second diffusion film 43a to an appropriate thickness. The first diffusion film 42a and the second diffusion film 43a may be, e.g., Al films.

A first diffusion prevention film 44a is formed on the first diffusion film 42a in the first trench 26, and a second diffusion prevention film 45a is formed on the second diffusion film 43a in the second trench 27. Specifically, the first diffusion prevention film 44a is conformally formed along the top surface of the first interlayer insulating film 20 and the sidewalls and bottom surface of the first trench 26. The second diffusion prevention film 45a is conformally formed along the top surface of the second interlayer insulating film 21 and the sidewalls and bottom surface of the second trench 27.

Figure 16:
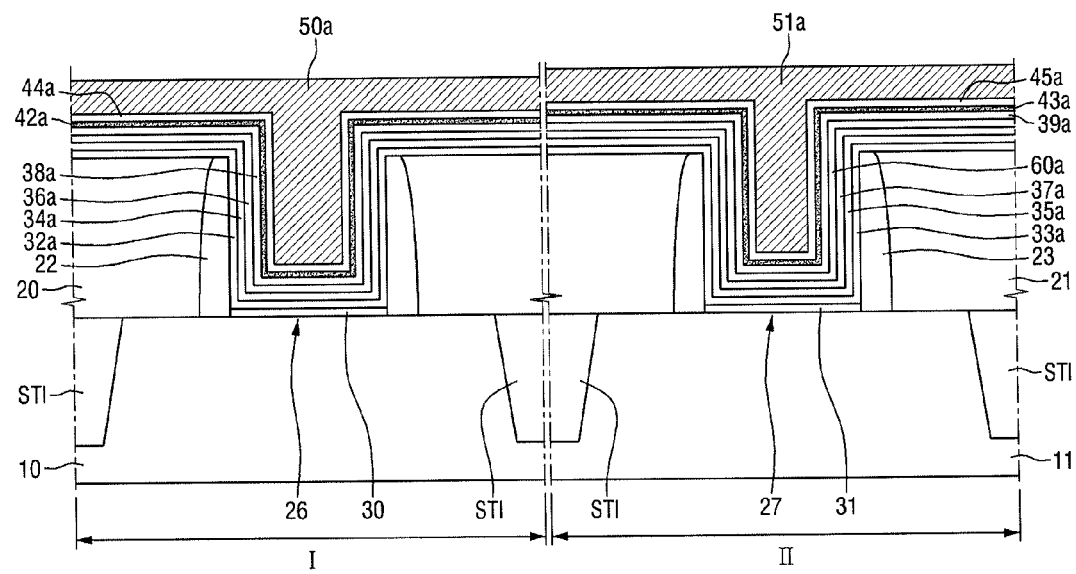

Referring to FIG. 16, a first gate metal structure 50a is formed on the first diffusion prevention film 44a in the first trench 26 to fill the first trench 26, and a second gate metal structure 51a is formed on the second diffusion prevention film 45a in the second trench 27 to fill the second trench 27. The first gate metal structure 50a and the second gate metal structure 51a contain a second diffusion material. The second diffusion material may be the same material as the first diffusion material. However, embodiments are not limited thereto.

Next, a heat treatment process may be performed to diffuse the first diffusion material contained in the first diffusion film 42a toward the etch stop film 36a. Specifically, the heat treatment process causes the first diffusion material contained in the first diffusion film 42a to diffuse into and/or onto the first gate insulating film 32a. However, the diffusion of the first diffusion material contained in the second diffusion film 43a is blocked by the work function adjustment film 60a of the second conductivity type. In addition, the second diffusion material contained in the first gate metal structure 50a is blocked from diffusing into and/or onto the first gate insulating film 32a by the first diffusion prevention film 44a, and the second diffusion material contained in the second gate metal structure 51a is blocked from diffusing into and/or onto the second gate insulating film 33a by the second diffusion prevention film 45a.

Referring to FIG. 4, a planarization process is performed to expose the top surface of the first interlayer insulating film 20 and the top surface of the second interlayer insulating film 21. The planarization process completes a first metal gate of a first conductivity type transistor in the first region I and a second metal gate of a second conductivity type transistor in the second region II. The first conductivity type may be an N type, and the second conductivity type may be a P type.

The above heat treatment process may be performed after the first gate insulating film 32a and the second gate insulating film 33a are formed or may be performed after the planarization process.

Figure 17:
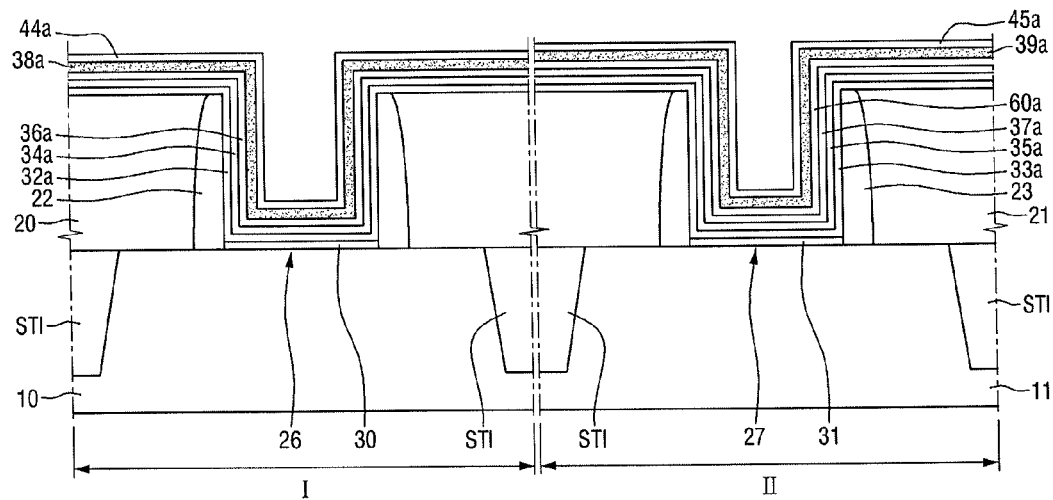
FIGS. 17 through 18 illustrate views of stages in a method of fabricating a semiconductor device according to a fifth embodiment.
Figure 18:
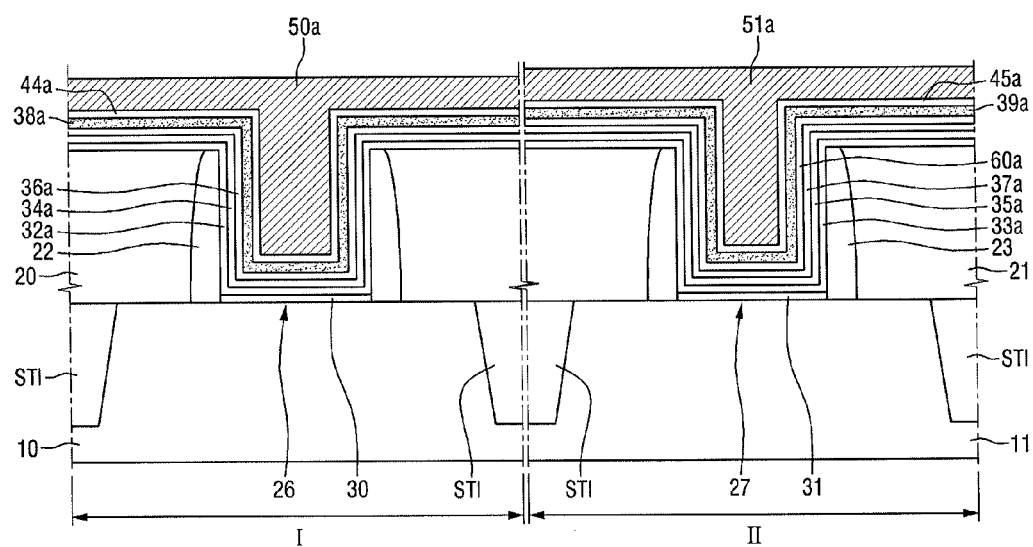

A method of fabricating the semiconductor device according to the fifth embodiment will now be described with reference to FIGS. 17, 18, and 5. For simplicity, any repetitive description of elements and features described above will be omitted, and the following description will focus on differences relative to the above fabrication method. FIGS. 17 through 18 are views illustrating intermediate processes included in a method of fabricating a semiconductor device according to the fifth embodiment.

Referring to FIG. 17, unlike in FIG. 15, first and second diffusion films (indicated by reference numerals 42a and 43a in FIG. 15) are not formed. Instead, a first work function adjustment film 38a of a first conductivity type and a second work function adjustment film 39a of the first conductivity type may serve as diffusion films. That is, the first work function adjustment film 38a of the first conductivity type is the first diffusion film (42a in FIG. 15), and the second work function adjustment film 39a of the first conductivity type is the second diffusion film (43a in FIG. 15). The first and second work function adjustment films 38a and 39a of the first conductivity type contain a first diffusion material, and the first diffusion material contained in the first work function adjustment film 38a of the first conductivity type may be diffused to under a first etch stop film 36a by a subsequent process.

The first work function adjustment film 38a of the first conductivity type and the second work function adjustment film 39a of the first conductivity type may contain a first metal which includes the first diffusion material and a second metal which is different from the first metal. A composition ratio of the first metal to the second metal may be about 2:1 to about 10:1. Here, the first metal may be, e.g., Al, and the second metal may be, e.g., Ti. However, embodiments are not limited thereto.

A first diffusion prevention film 44a is formed on the first diffusion film 38a in the first trench 26, and a second diffusion prevention film 45a is formed on the second diffusion film 39a in the second trench 27. Here, the first diffusion prevention film 44a may be formed by nitriding an upper portion of the first diffusion film 38a, and the second diffusion prevention film 45a may be formed by nitriding an upper portion of the second diffusion film 39a.

Referring to FIG. 18, a first gate metal structure 50a is formed on the first diffusion prevention film 44a in the first trench 26 to fill the first trench 26, and a second gate metal structure 51a is formed on the second diffusion prevention film 45a in the second trench 27 to fill the second trench 27. Then, a heat treatment process is performed to diffuse the first diffusion material contained in the first work function adjustment film 38a of the first conductivity type toward the first etch stop film 36a.

Referring to FIG. 5, a planarization process is performed to expose a top surface of a first interlayer insulating film 20 and a top surface of a second interlayer insulating film 21. The planarization process completes a first metal gate of a first conductivity type transistor in a first region I and a second metal gate of a second conductivity type transistor in a second region II.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    an interlayer insulating film on a substrate, the interlayer insulating film including a trench;
    a gate insulating film in the trench, the gate insulating film being conformal along sidewalls and a bottom surface of the trench;
    a diffusion film on the gate insulating film, the diffusion film including a first diffusion material;
    a work function adjustment film under the diffusion film, the work function adjustment film including the first diffusion material;
    a gate metal structure on the diffusion film, the gate metal structure including a second diffusion material; and
    a diffusion prevention film between the gate metal structure and the diffusion film, the diffusion prevention film being configured to prevent diffusion of the second diffusion material from the gate metal structure,
    wherein a first diffused material diffused from the diffusion film exists in the gate insulating film.

2. The semiconductor device as claimed in claim 1, wherein the first diffusion material is the same as the second diffusion material.

3. The semiconductor device as claimed in claim 1, further comprising a diffusion control film under the diffusion film, the diffusion control film being configured to control diffusion of the first diffusion material from the diffusion film.

4. The semiconductor device as claimed in claim 1, wherein:
    a content of the first diffusion material in the diffusion film is greater than a content of the first diffusion material in the work function adjustment film, and
    the content of the first diffusion material in the work function adjustment film is greater than a content of the first diffusion material in the gate insulating film.

5. The semiconductor device as claimed in claim 1, wherein the diffusion film is a work function adjustment film of a first conductivity type.

6. The semiconductor device as claimed in claim 5, wherein the first conductivity type includes an N type.

7. The semiconductor device as claimed in claim 5, wherein the diffusion prevention film is defined by nitride in an upper portion of the diffusion film.

8. The semiconductor device as claimed in claim 5, wherein the work function adjustment film of the first conductivity type includes a first metal and a second metal, the first metal being the first diffusion material, the second metal being different from the first metal, and a composition ratio of the first metal to the second metal is about 2:1 to about 10:1.

9. The semiconductor device as claimed in claim 1, wherein the gate insulating film includes at least one of $HfSiON$, $HfO_2$, $ZrO_2$, $Ta_2O_5$, $TiO_2$, $SrTiO_3$, and $(Ba,Sr)TiO_3$.

10. The semiconductor device as claimed in claim 8, wherein the first metal includes Al, and the second metal includes Ti.

11. A semiconductor device, comprising:
    an interlayer insulating film on a substrate, the interlayer insulating film including a first trench and a second trench;
    an etch stop film in the first trench and the second trench;
    a work function adjustment film of a second conductivity type only on the etch stop film in the second trench, the work function adjustment film of the second conductivity type including a diffusion material;
    a work function adjustment film of a first conductivity type on the etch stop film in the first trench, the work function adjustment film of the first conductivity type including the diffusion material;
    a gate metal structure on the work function adjustment film of the first conductivity type, the gate metal structure including a same diffusion material as the diffusion material in the work function adjustment film of the first conductivity type; and
    a diffusion prevention film between the gate metal structure and the work function adjustment film of the first conductivity type, the diffusion prevention film being configured to prevent diffusion of the diffusion material from the gate metal structure to a lower part of the first trench,
    wherein a diffused material diffused from the work function adjustment film of the first conductivity type exists in the etch stop film in the first trench,
    wherein the work function adjustment film of the first conductivity type includes a first metal, which is the diffusion material, and a second metal, which is different from the first metal, and a composition ratio of the first metal to the second metal is about 2:1 to about 10:1.

12. The semiconductor device as claimed in claim 11, further comprising a gate insulating film under the etch stop film, the diffused material diffused from the work function adjustment film of the first conductivity type existing in the gate insulating film.

13. The semiconductor device as claimed in claim 12, wherein, in the first trench, a content of the diffusion material in the work function adjustment film of the first conductivity type is greater than that of the diffusion material in the etch stop film, and the content of the diffusion material in the etch stop film is greater than that of the diffusion material in the gate insulating film.

14. The semiconductor device as claimed in claim 11, wherein the diffusion prevention film is defined by nitride in an upper portion of the work function adjustment film of the first conductivity type.

15. A semiconductor device, comprising:
    an interlayer insulating film on a substrate, the interlayer insulating film including a trench;
    a gate insulating film in the trench;
    a diffusion film on the gate insulating film, the diffusion film including a first diffusion material;
    a work function adjustment film under the diffusion film, the work function adjustment film including the first diffusion material;
    a gate metal structure on the diffusion film, the gate metal structure including a second diffusion material; and
    a diffusion prevention film between the gate metal structure and the diffusion film, the diffusion prevention film being configured to prevent diffusion of the second diffusion material from the gate metal structure,
    wherein the second diffusion material is only in the gate metal structure among the interlayer insulating film, the gate insulating film, the diffusion film, and the gate metal structure, and wherein the first diffusion material is at least in the diffusion film and in the gate insulating film, the first diffusion material in the gate insulating film being a first diffused material diffused from the diffusion film.

16. The semiconductor device as claimed in claim 15, wherein an amount of the first diffusion material decreases as a distance from the diffusion film increases, the distance from the diffusion film being measured in a direction oriented from the diffusion film toward a surface of the trench.

17. The semiconductor device as claimed in claim 15, wherein the diffusion prevention film includes at least one of TiN, TaN, WN, and TiAlN.

18. The semiconductor device as claimed in claim 17, wherein the first diffusion material is aluminum and the second diffusion material is aluminum or tungsten.

19. The semiconductor device as claimed in claim 15, wherein the diffusion prevention film has a thickness of about 5 Å to about 50 Å.

* * * * *